(12) United States Patent
Hartjes et al.

(10) Patent No.: US 8,345,219 B2
(45) Date of Patent: Jan. 1, 2013

(54) METHOD AND APPARATUS FOR SETTING AN ILLUMINATION OPTICAL UNIT

(75) Inventors: Joachim Hartjes, Aalen (DE); Stig Bieling, Aalen (DE); Artur Hoegele, Obekochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 13/469,240

(22) Filed: May 11, 2012

(65) Prior Publication Data

US 2012/0300195 A1 Nov. 29, 2012

Related U.S. Application Data

(60) Provisional application No. 61/489,750, filed on May 25, 2011.

(30) Foreign Application Priority Data

May 25, 2011 (DE) .......................... 10 2011 076 435

(51) Int. Cl.
*G03B 27/68* (2006.01)
*G03B 27/54* (2006.01)
*G03B 27/32* (2006.01)
*G03B 27/52* (2006.01)
*G03B 27/42* (2006.01)

(52) U.S. Cl. ................ 355/52; 355/53; 355/55; 355/67; 355/77

(58) Field of Classification Search .................... 355/30, 355/52, 53, 55, 67–71, 77; 430/8, 22, 30, 430/311, 312, 322; 359/290–297; 250/492.1, 250/492.2, 492.22, 548

See application file for complete search history.

(56) References Cited

U.S. PATENT DOCUMENTS 5,684,566 A * 11/1997 Stanton ........................... 355/67
5,986,795 A * 11/1999 Chapman et al. .......... 359/224.1

(Continued)

FOREIGN PATENT DOCUMENTS

DE 10 2008 021 833 7/2009

OTHER PUBLICATIONS

German examination report, with English translation, for corresponding DE Appl No. 10 2011 076 435.6, dated Feb. 13, 2012.

*Primary Examiner* — Toan Ton
*Assistant Examiner* — Christina Riddle
(74) *Attorney, Agent, or Firm* — Fish & Richardson P.C.

(57) ABSTRACT

A method for setting an illumination optical unit involves determining an actual value of an intensity-weighted illumination parameter of the illumination optical unit for multiple field points and for multiple illumination angles. The influence of a deformation of at least one of the optical surfaces of the illumination optical unit on the at least one illumination parameter is then determined. A desired value of the illumination parameter is then predefined. A desired form of the at least one optical surface is determined so that the actual value of the illumination parameter corresponds to the desired value of the illumination parameter within predefined limits. Finally, the optical surface is deformed with the aid of at least one actuator so that an actual form of the optical surface corresponds to the desired form.

11 Claims, 5 Drawing Sheets

U.S. PATENT DOCUMENTS

| | | | |
|---|---|---|---|
| 6,504,597 B2 * | 1/2003 | Schuster et al. | 355/67 |
| 6,794,100 B2 * | 9/2004 | Boettiger et al. | 430/30 |
| 6,803,994 B2 * | 10/2004 | Margeson | 355/53 |
| 7,125,128 B2 * | 10/2006 | Novak | 359/849 |
| 7,446,855 B2 * | 11/2008 | Byers | 355/67 |
| 2002/0036758 A1 | 3/2002 | De Mol et al. | |
| 2004/0053148 A1 * | 3/2004 | Morohoshi | 430/30 |

* cited by examiner

METHOD AND APPARATUS FOR SETTING AN ILLUMINATION OPTICAL UNIT

CROSS-REFERENCE TO RELATED APPLICATIONS

This application claims benefit under 35 U.S.C. §119(e)(1) to U.S. Provisional Application No. 61/489,750, filed May 25, 2011. This application also claims benefit under 35 U.S.C. §119 to German Application No. 10 2011 076 435.6, filed May 25, 2011. The contents of both of these priority applications are hereby incorporated by reference in their entireties.

BACKGROUND

The disclosure relates to methods and to apparatus for setting an illumination optical unit that includes multiple optical surfaces for guiding and shaping a beam of illumination light. Furthermore, the disclosure relates to illumination optical units that include a setting apparatus of this type, optical systems that include an illumination optical unit of this type, projection exposure apparatus that include an optical system of this type, methods for producing a patterned component with a projection exposure apparatus of this type, and patterned components thus produced.

Setting methods are disclosed in DE 10 2008 021 833 A1.

Particularly for imaging requirements during the production of micro- or nanostructured components, it is desirable to illuminate an object field to be imaged in an exactly defined manner with regard to its illumination angle distribution and intensity distribution. However, different illumination conditions with regard to the illumination angles and/or with regard to the illumination intensities may be present at the edge of the object field compared to those in the center of the field.

SUMMARY

Methods for compensating imaging aberrations and/or undesirable deviations of an illumination parameter from a predefined value, e.g., for field edge effects, are disclosed.

It has been found that there are specific, universal illumination parameters, knowledge of which at specific locations within the illumination optical unit leads to the possibility of predefining a surface suitable for imaging aberration compensation, and a deformation to which this optical surface has to be subjected in order to compensate for the imaging aberration. Compensation of this type can be advantageous particularly when extremely high imaging precision is of importance and/or when layer effects at the field edge are unavoidable. Exemplary applications for the setting methods include optical units for microlithography having a used light wavelength in the DUV or in the EUV. In some embodiments, it may suffice to deform a single optical surface of the illumination optical unit to achieve the desired illumination parameter within predefined limits. Depending on the design of the illumination optical unit and depending on the desired accuracy with which the desired illumination parameter is intended to be achieved, it is also possible for more than one optical surface or even all optical surfaces to be deformed. In this case, the optical surfaces can be selected based on the effect of a change in their form on the phase of a wavefront. The deformation can be used, in particular, for compensating illumination parameters of ellipticity and uniformity in the case of specific illumination settings. Examples of such illumination settings include an annular illumination setting, an X-dipole illumination setting, a Y-dipole illumination setting and a C-quad setting. A C-quad setting is an illumination from the direction of four partial-ring regions which are arranged in a circumferential direction around a center of a pupil in each case with a circumferential extent of 30° in a manner distributed equally at the same distance around said center. A C-quad setting is comparable to a superposition of an X-dipole illumination setting and a Y-dipole illumination setting. The X-dipole illumination setting, the Y-dipole illumination setting and the C-quad setting represent examples of a multipole illumination of the object field. Because an optical unit downstream of an object field, for example a projection optical unit, can also influence illumination parameters such as, for example, the ellipticity or the telecentricity, the illumination angle distribution can also be set such that the deformation affords a bias for the overall system (composed of the illumination optical unit upstream of the object field and an optical unit disposed downstream), for example a projection optical unit. The intensity-weighted illumination parameter can be determined at every field point or can be determined at selected field points.

In some embodiments, determining the actual value of the illumination parameter using an intensity-weighted distortion of an illumination pupil and an intensity-weighted local area change in the illumination pupil have been found to be illumination parameters that are particularly suitable for the setting method for illumination description and/or imaging description. The intensity-weighted distortion and the intensity-weighted local area change represent examples of the intensity-weighted illumination parameter which is used in the setting method.

A simulation can be used to yield a basis for the predefinition of the deformation given exact knowledge of the design variables of the illumination optical unit and of a source for the illumination light. Alternatively or additionally, it is possible to carry out a measurement of the wavefront for the predefinition of the deformation.

A function set description can make possible exact wavefront determination. Zernike polynomials, whose symmetry is well adapted to the optical boundary conditions, can be chosen as the function set.

Target value setting can make it possible to select specific illumination and/or imaging aberration contributions, such that these contributions can be determined in a targeted manner. The target value can be zero, for example. Target value setting can be effected when determining the intensity-weighted illumination parameter and/or when determining the deformation influence. By virtue of the target value setting it is possible to adapt the function set such that the result of the setting method is a desired form which can be achieved with the aid of a deformation with predefined symmetry.

In certain embodiments, the advantages of a setting apparatus correspond to those which have already been explained above with reference to the setting method. In so far as the optical surface to be deformed is a mirror surface, the actuators of the deformation device can also act on the mirror from its rear side. An actuator adjustable in a driven manner, e.g. a piezo-actuator, a pneumatic actuator, a hydraulic actuator, or an actuator that can be set mechanically, for example an actuator that can be set using micrometer screws, can be used as actuator. A fluid dependent on the presence of an electric field, for example a magnetorheological fluid (MRF), can also be used as actuator actuating drive.

In some embodiments, a plurality of actuators can be distributed over the optical surface to be deformed such that the symmetry of the arrangement of the actuators is adapted to the symmetry of the deformation.

The advantages of the setting method and setting apparatus discussed previously can be applied to illumination optical units, optical systems, projection exposure apparatus, production methods and/or components prepared using the method or apparatus. The optical surfaces can be refractive and/or reflective optical surfaces.

BRIEF DESCRIPTION OF THE DRAWINGS

Exemplary embodiments are explained in greater detail below with reference to the drawings, in which.

DETAILED DESCRIPTION

Figure 1:
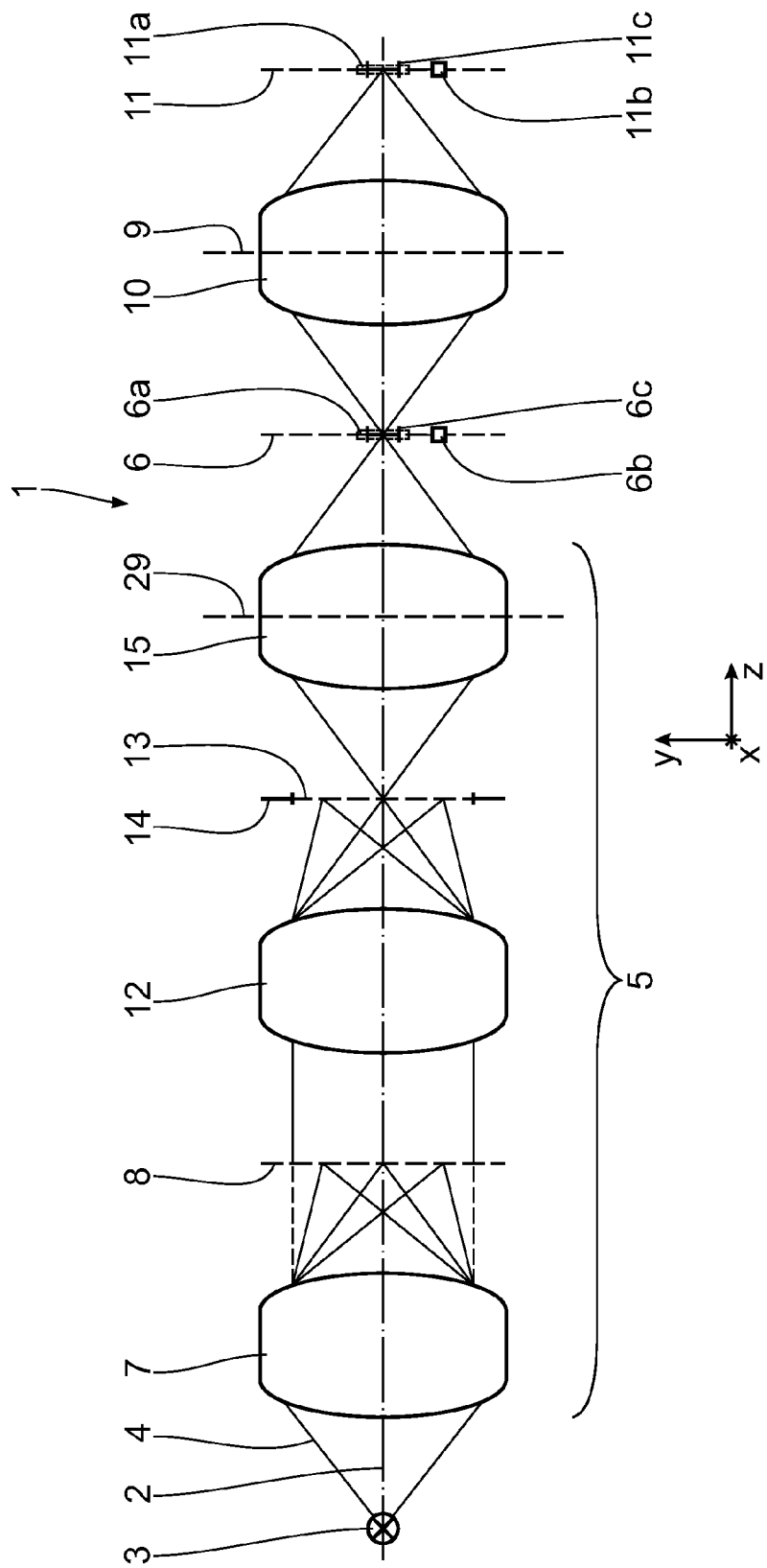
FIG. 1 shows schematically in meridional section optical main groups of an embodiment of a projection exposure apparatus for microlithography.

A projection exposure apparatus 1, as far as its optical main groups are concerned, is schematically illustrated in meridional section in FIG. 1. While this schematic illustration shows the optical main groups as refractive optical elements, the optical main groups can be embodied as diffractive or reflective components or as combinations or subcombinations of refractive/diffractive/reflective assemblies of optical elements.

In order to facilitate the representation of positional relationships, an x-y-z-coordinate system is shown. In FIG. 1, the x-axis runs perpendicularly to the plane of the drawing. The y-axis runs upwards in FIG. 1. The z-axis runs towards the right and parallel to an optical axis 2 of the projection exposure apparatus 1. Said optical axis 2 can also be multiply folded, if appropriate.

The projection exposure apparatus 1 has a radiation source 3, which generates light in the form of an illumination or imaging beam 4. The light 4 has a wavelength in the DUV, for example in the range of between 100 and 200 nm. Alternatively, the used light 4 can have a wavelength in the EUV, in particular in the range of between 5 and 30 nm. The light 4 is also referred to as illumination light or imaging light.

An illumination optical unit 5 guides light 4 from radiation source 3 towards an object plane 6 of projection exposure apparatus 1. An object to be imaged by projection exposure apparatus 1 in the form of a reticle 6a is arranged in object plane 6. Reticle 6a is indicated in a dashed fashion in FIG. 1. Reticle 6a is held by a reticle holder 6b. A section of reticle 6a which is arranged in an object field 6c is illuminated. Object field 6c lies in the object plane 6.

As first optical main group, illumination optical unit 5 includes a pupil shaping optical unit 7, which generates a defined intensity distribution of light 4 in a pupil plane 8 downstream from pupil shaping optical unit 7. Pupil shaping optical unit 7 images radiation source 3 into a plurality of secondary light sources. Pupil shaping optical unit 7 can also have a field shaping function. Facet elements, honeycomb elements and/or diffractive optical elements can be used in pupil shaping optical unit 7. Pupil plane 8 is optically conjugate with respect to a further pupil plane 9 of a projection objective lens 10 of projection exposure apparatus 1, which is disposed downstream of illumination optical unit 5 between object plane 6 and an image plane 11. A wafer 11a is arranged in image plane 11 and is indicated in a dashed fashion in FIG. 1. Wafer 11a is held by a wafer holder 11b illustrated schematically. Object field 6c is imaged by projection objective lens 10 into an image field 11c on wafer 11a in image plane 11.

A field lens group 12 as a further optical main group of illumination optical unit 5 is disposed downstream of pupil plane 8 arranged downstream of pupil shaping optical unit 7.

An intermediate image plane 13, which is conjugate with respect to object plane 6, is arranged downstream of field lens group 12. Intermediate image plane 13, object plane 6 and image plane 11 constitute field planes of projection exposure apparatus 1. A diaphragm 14 for predefining a marginal delimitation of an object field to be illuminated in object plane 6 lies in intermediate image plane 13. Diaphragm 14 is also referred to as an REMA (Reticle Masking System for stopping down reticle 6a) diaphragm.

Intermediate image plane 13 is imaged into object plane 6 by an objective lens group 15, which is also designated as a REMA lens group. Objective lens group 15 constitutes a further optical main group of illumination optical unit 5.

Figure 2:
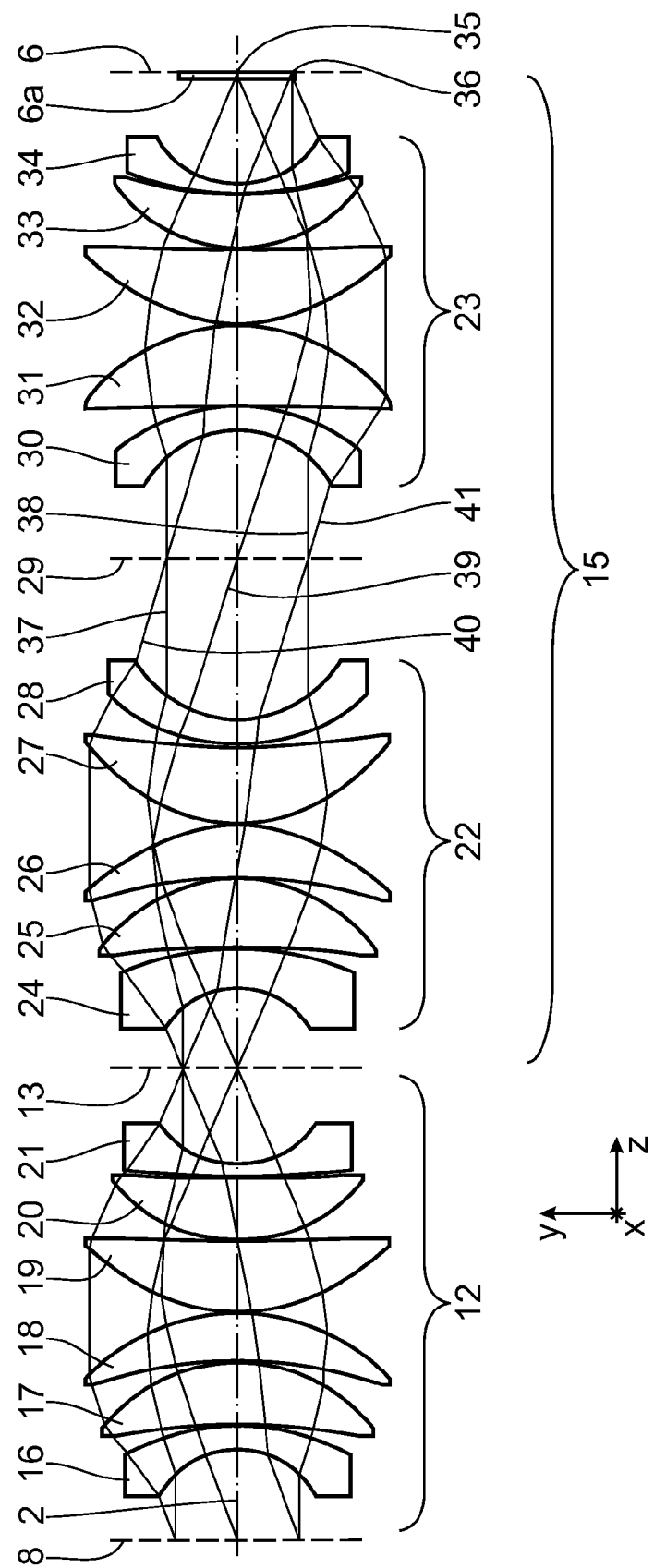
FIG. 2 shows in greater detail two of the optical main groups of an illumination optical unit of the projection exposure apparatus according to FIG. 1.

FIG. 2 shows field lens group 12 and REMA lens group 15 in greater detail. Field lens group 12 has a total of 6 lenses 16 to 21 arranged in succession. REMA lens group 15 has two partial lens groups 22, 23 downstream of intermediate image plane 13. First partial lens group 22 includes a total of five lenses 24 to 28. A further pupil plane 29 lies between the two partial lens groups 22, 23 of REMA lens group 15. The second partial lens group 23 includes five lenses 30 to 34. Object plane 6 with reticle 6a is disposed downstream of the last lens of the second partial lens group 23 in the ray direction.

The optically used regions within pupil planes 8, 9, 29 are also each referred to as an illumination pupil.

FIG. 2 illustrates the imaging beam paths with respect to two field points, namely a central object field point 35 and an edge field point 36 at the edge of the object field. Central object field point 35 is arranged at the point of intersection of optical axis 2 through object plane 6. Edge field point 36 is arranged at the field edge of the object field located in the negative y-direction. Reticle holder 6b and wafer holder 11b are moved simultaneously in the y-direction during the projection operation of the projection exposure apparatus 1. Alongside optical axis 2, the illumination beam path of central object field point 35 is characterized by two marginal rays 37, 38, which represent the maximum illumination angles of the central object field point 35. The illumination beam path of edge field point 36 is characterized by a chief ray 39, which passes through pupil planes 8, 29 centrally, and by two marginal rays 40, 41, which represent the maximum illumination angles of edge field point 36.

The illumination setting of illumination optical unit 5 results in a corresponding distribution of the illumination angles for the field points of the object field. In other words, the illumination angles for the field points of the object field depend on an intensity distribution set using pupil shaping optical unit 7 in pupil plane 8.

Figure 3:
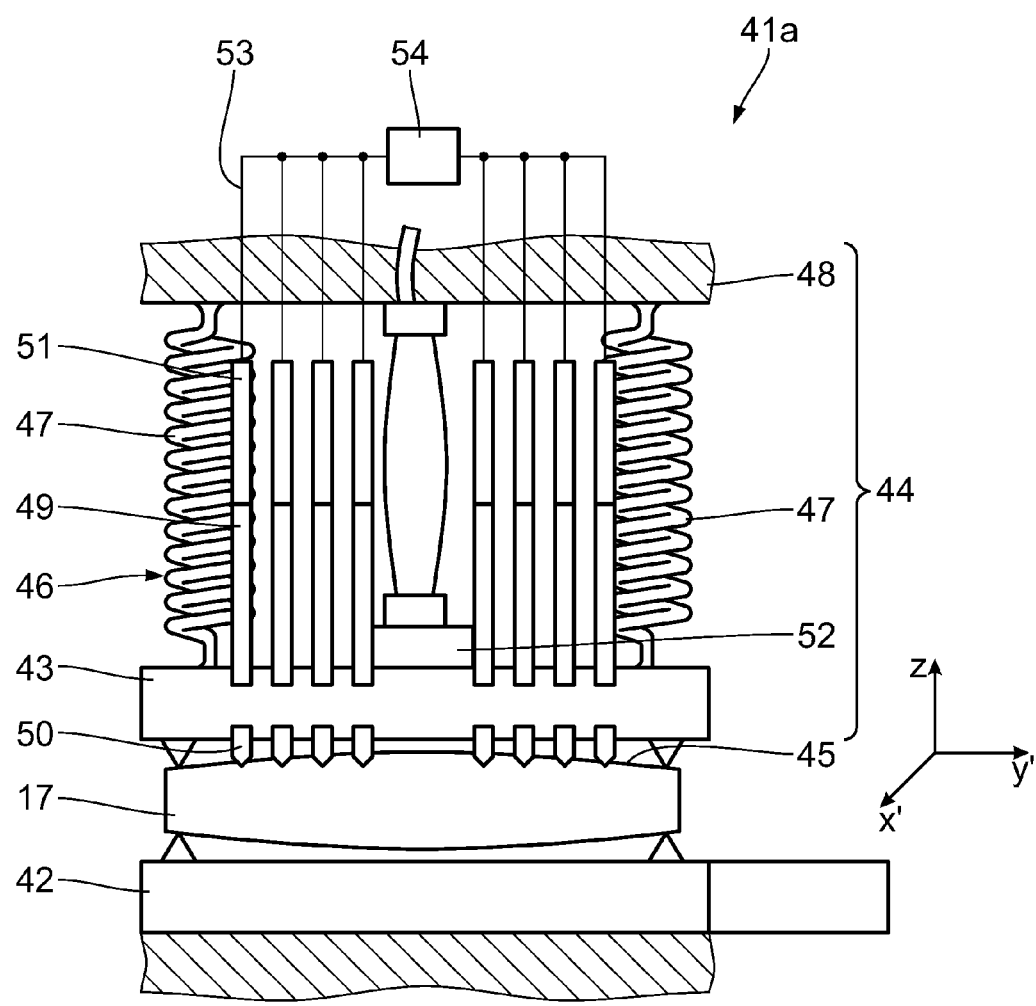
FIG. 3 shows a side view of a schematically illustrated lens of a field lens group from the illumination optical unit according to FIG. 2 with a setting apparatus, including a deformation device for an optical surface of the lens, and a determining and predefining device for determining an actual value of the illumination parameter of the illumination optical unit and for predefining a desired value of the illumination parameter.

FIG. 3 shows an embodiment of a setting apparatus 41a for illumination optical unit 5. FIG. 3 shows, by way of example, just one of the lenses of field lens group 12, namely lens 17. Lens 17 is mounted between a stationary mount unit 42 and a movable mount unit 43, which is part of a deformation device 44. Deformation device 44 exerts a stress on an optical surface 45 of lens 17 in a defined spatially distributed manner. A form of optical surface 45 can be described as a function z, depending on local coordinates x' and y' of optical surface 45, that is to say in the form z (x', y').

Deformation device 44 has a prestressing unit 46, which is formed by two compression springs 47 supported between movable mount unit 43 and an abutment 48. Using prestressing unit 46, a basic stress is exerted on optical surface 45, with respect to which the actual deformation stresses act additively.

Deformation device 44 also includes multiple actuator units or actuators 49. A total of eight actuator units 49 are illustrated in FIG. 3. In practice, the number of actuator units can vary in the range of between 4 and several tens. Actuator units 49 are arranged marginally with respect to lens 17. In other words, actuator units 49 are mechanically operatively connected to optical surface 45 using actuator bodies 50 on the edge not exposed to illumination light 4.

Each actuator unit 49 has an actuator actuating drive 51 for predefining a deformation force or actuating force exerted on optical surface 45 by the respective actuator unit via actuator bodies 50.

The arrangement of operative points via which actuator bodies 50 bear on optical surface 45 is adapted with regard to their symmetry in the circumferential direction about the z-axis to a deformation symmetry to be predefined. If, by way of example, a diagonal symmetry of a deformation D of optical surface 45 is desired, the arrangement of the actuator bodies 50 is correspondingly diagonally symmetrical about the z-axis. The deformation D can likewise be described depending on the local coordinates x', y' of optical surface 45.

The result of the actuating forces exerted on optical surface 45 using actuator units 49 and the deformation stresses thereby taking effect is the deformation D (x', y') in the z-direction. In other words, the deformation is perpendicularly to the x', y' plane, depending on the respective coordinate x', y' on optical surface 45. On account of the deformation D (x', y'), optical surface 45 attains a deformed form z (x', y'), relative to its original form which it has without the action of the actuating forces of actuator units 49.

Between actuator actuating drives 51 and actuator bodies 50, actuator units 49 can additionally have force translation elements, which can be used to translate an actuating force predefined by actuator actuating drives 51 into an actuating force exerted on optical surface 45 by actuator bodies 50. Translation units of this type can be embodied as leverage translation units (not illustrated in the drawing).

The prestress exerted on optical surface 45 by prestressing unit 46 is measured using a force measuring unit 52.

Each actuator actuating drives 51 is signal-connected via a signal line 53 to a determining and predefining device 54, whose function is explained below.

An intensity distribution of illumination light 4 in one of the pupil planes, for example in pupil plane 8, and an intensity distribution of illumination light 4 in a field plane, for example, in object plane 6, can be characterized by illumination parameters which are weighted with the intensity of illumination light 4.

Examples of illumination parameters are an intensity-weighted pupil distortion ($\Delta\xi$, $\Delta\eta$) and an intensity-weighted local area change in the illumination pupil $\delta A/A$.

In this case, $\xi$ and $\eta$ denote the direction cosines in the illumination pupil, that is to say the pupil coordinates corresponding to the field coordinates x, y.

It is believe that the following mathematical relationships hold true:

$$(\Delta\xi, \Delta\eta) = -\left(\frac{\partial}{\partial \chi}, \frac{\partial}{\partial y}\right)(wfr(\xi, \eta, x, y)) * g(\xi, \eta, x, y) \quad (1)$$

$$\frac{\delta A}{A} = \quad (2)$$

$$\frac{\partial}{\partial \xi}\Delta\xi + \frac{\partial}{\partial \eta}\Delta\eta = -\left(\frac{\partial}{\partial \xi}\frac{\partial}{\partial x} + \frac{\partial}{\partial \eta}\frac{\partial}{\partial y}\right)wfr(x, y, \xi, \eta) * g(\xi, \eta, x, y)$$

In this case, x, y are the field coordinates.

wfr($\xi$, $\eta$, x, y) denotes the wavefront of illumination light 4, which is dependent on the two field coordinates x, y and on the two pupil coordinates $\xi$, $\eta$.

g($\xi$, $\eta$, x, y) denotes, as an intensity weighting function, the respective illumination setting, namely a diaphragm or mask function in the illumination pupil. In other words, g($\xi$, $\eta$, x, y) is a function which, in one of pupil planes 8, 9, 29, assumes the value 0 for specific pupil coordinates $\xi$, $\eta$ and the value 1 for other pupil coordinates $\xi$, $\eta$. The function g is also designated as a setting mask.

Determining and predefining device 54 determines the intensity-weighted illumination parameters of illumination optical unit 5, i.e., the intensity-weighted pupil distortion and the intensity-weighted local area change in the illumination pupil, at a plurality of field points. This can be done by simulation on the basis of the design data of illumination optical unit 5 and radiation source 3 or by measurement of the intensity distribution of illumination light 4 in a field plane of illumination optical unit 5 and by measurement of an intensity distribution of illumination light 4 in a pupil plane of illumination optical unit 5 in the case of a predefined illumination setting.

Examples of possible illumination settings include conventional illumination settings, annular illumination settings with settable maximum and minimum illumination angles, and dipole settings with settable maximum and minimum illumination angles and with a settable pole width and pole direction. Examples of illumination settings of this type are specified in DE 10 2008 021 833 A1.

From the intensity-weighted pupil distortion at each field point, on the one hand, and from the intensity-weighted local area changes in the illumination pupil at each field point, on the other hand, the illumination variables that are relevant to the illumination of object field 6c can be calculated. Examples include a geometrical telecentricity, an illumination angle variation, a uniformity of the illumination, a pole balance, an ellipticity and an energetic telecentricity proportion.

It is believed that the following mathematical relationships hold true:

Telecentricity tel in the x- and y-direction:

$$(tel\_x, tel\_y) = \int_R\int_\Phi (\Delta\xi, \Delta\eta) dR d\Phi \quad (3)$$

Sigma—Variation dσ for a Predefined Setting—Contour (Predefined R):

$$d\sigma\text{in(out)} = \int_\Phi ((\Delta\xi - \text{mean}(\Delta\xi))\cos\Phi + (\Delta\eta - \text{mean}(\Delta\eta))\sin\Phi))d\Phi|_{Rin(out)} \quad (4)$$

$$\text{Uniformity } U : U = \frac{\sigma\_out^2 - \sigma\_in^2}{(\sigma\_out + d\sigma\_out)^2 - (\sigma\_in + d\sigma\_in)^2} - 1 \quad (5)$$

Pole balance pb in $x-$ and $y-$ direction: (6)

$$\text{pb\_x} = \frac{1}{2}\left(\int_R\int_{\Phi 1}\frac{\delta A}{A}dRd\Phi - \int_R\int_{\Phi 3}\frac{\delta A}{A}dRd\Phi\right)$$

$$\text{pb\_y} = \frac{1}{2}\left(\int_R\int_{\Phi 2}\frac{\delta A}{A}dRd\Phi - \int_R\int_{\Phi 4}\frac{\delta A}{A}dRd\Phi\right) \quad (7)$$

$$\text{Ellipticity } E : E = \int_{R\Phi 2}\int_{\Phi 4}\frac{\delta A}{A}dRd\Phi - \int_{R\Phi 1}\int_{\Phi 3}\frac{\delta A}{A}dRd\Phi \quad (8)$$

Pole Balance Induced x-Telecentricity:

$$\text{tel\_pb\_x} = \text{pb\_x}*NA \quad (9)$$

Total x-Telecentricity:

$$\text{tel\_total\_x} = \text{tel\_x} + \text{tel\_pb\_x} \quad (10)$$

In this case, NA is the object-field-side numerical aperture of illumination optical unit 5. Other variables specified are as follows:
σ: illumination angle
σin: inner, minimum illumination angle
σout: outer, maximum illumination angle
R: pupil radius
Φ1, Φ3: x-pupil quadrants
Φ2, Φ4: y-pupil quadrants
Φ=Φ1+Φ2+Φ3+Φ4
"mean" denotes formation of a mean value.

These illumination variables correspond to those described in DE 10 2008 021 833 A1.

In order to determine the intensity-weighted pupil distortion and/or the intensity-weighted local area change in the illumination pupil, it is possible to consider a phase profile of the wavefront wfr of illumination light 4 on the one hand in one of the field planes and on the other hand in one of the pupil planes of illumination optical unit 5. This consideration can be effected by calculation on the basis of the optical design data or by measurement. This determination can be done with the aid of a description of a wavefront using an orthogonal function set. One example of a function set of this type is Zernike polynomials. Individual functions of the function set can be set to a target value, for example to the value zero. The contribution of individual functions of the orthogonal function set to the total shape of the wavefront can be considered in this way. This target value allocation of Zernike polynomials is also designated as a Zernike mask in the manner corresponding to the setting mask already mentioned above.

Figure 4:
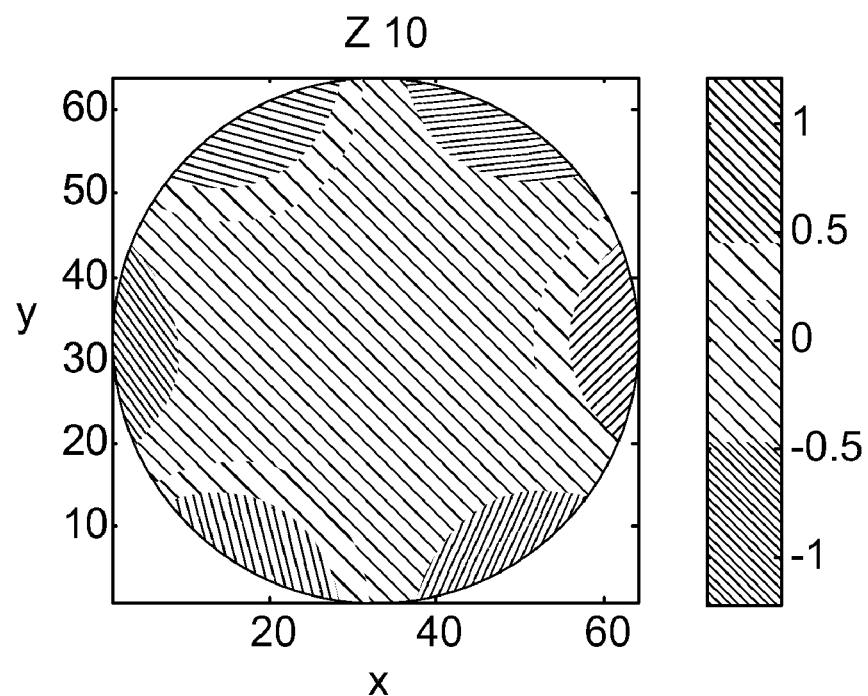
FIG. 4 shows an x-y plot indicating a wavefront deformation of illumination light in a field plane of the illumination optical unit.

FIG. 4 illustrates the deformation contribution of the Zernike polynomial Z10 over an illumination pupil, that is to say in pupil coordinates. The wavefront deviation in units of the wavelength is shown.

Figure 5:
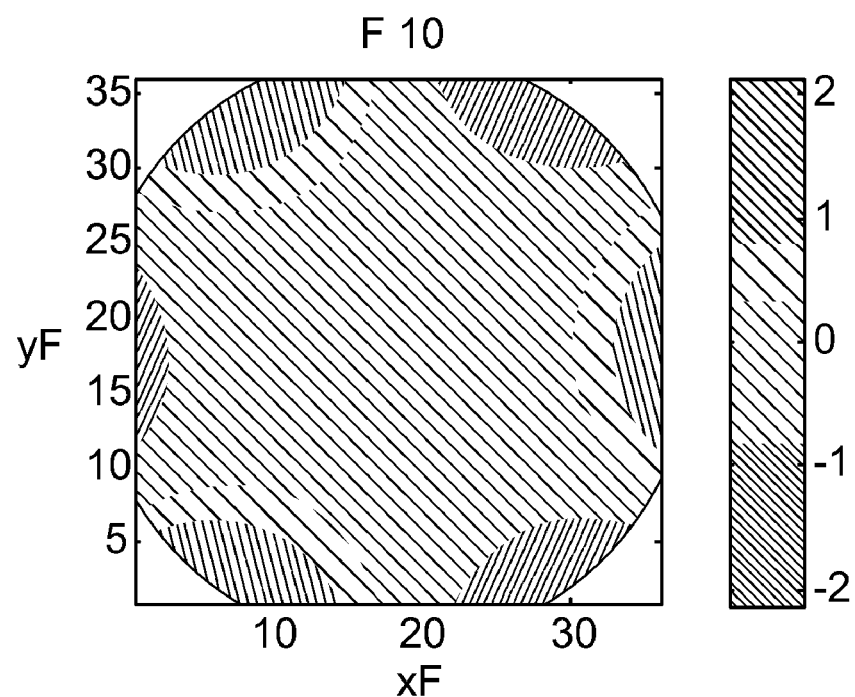
FIG. 5 shows an x-y plot indicating a wavefront deformation, corresponding to the wavefront deformation according to FIG. 4, in a pupil plane of the illumination optical unit.

FIG. 5 shows a corresponding profile of the wavefront deviation over the field.

Figure 6:
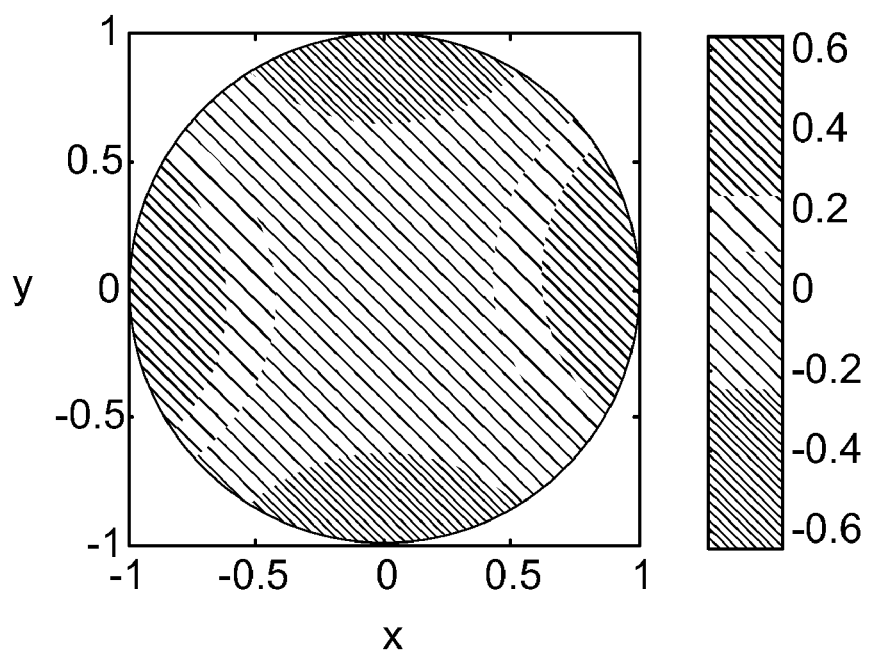
FIG. 6 shows an x-y plot indicating a local area change in an illumination pupil, as seen from a marginal field point, with a symmetry which is suitable for the compensation of the wavefront deviations according to FIGS. 4 and 5.
Figure 7:
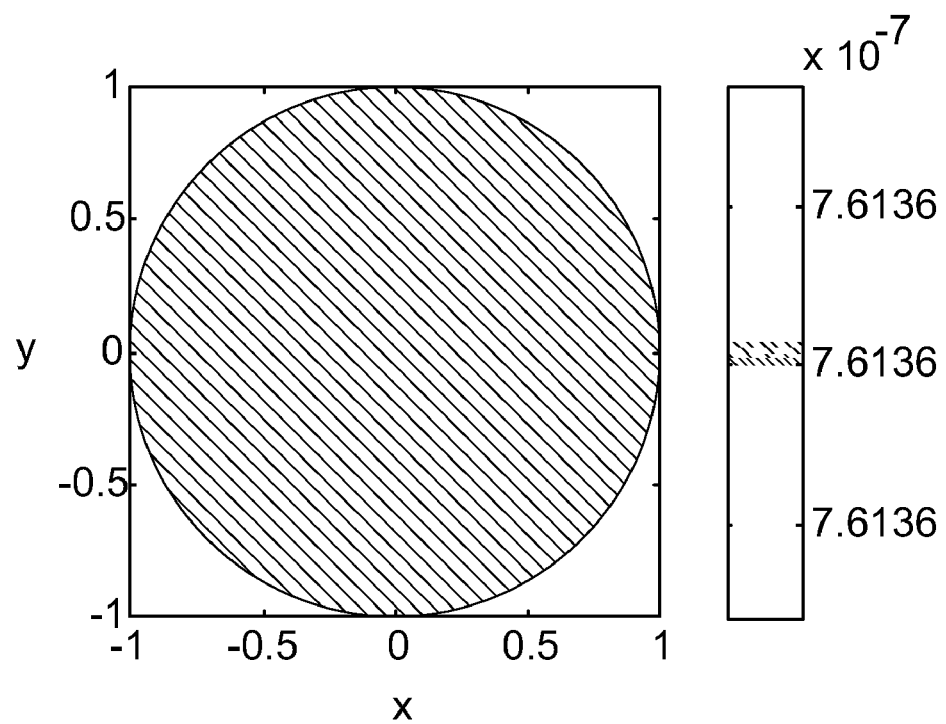
FIG. 7 shows an x-y plot indicating the local area change over the illumination pupil, as seen from a central field point.

FIGS. 6 and 7 show local area changes at the location of optical surface 45, calculated by device 45, which lead to a wavefront profile corresponding to FIGS. 4 and 5, in other words which can be used compensating the illustrated wavefront deformations.

The diagrams are scaled to 100λ. The value 1 therefore corresponds to a wavefront change of 100 wavelengths.

A local area change over the illumination pupil for two different field points is respectively specified, namely for a marginal field point (x, y)=(54.5, 0) in FIG. 6 and for a central field point (x, y)=(0, 0) in FIG. 7.

From the values for the intensity-weighted local area change in the pupil it is possible to determine a deformation D (x', y'), where x', y' are coordinates spanning optical surface 45 and D denotes the deformation of optical surface 45 at the respective location x', y' on the optical surface 45.

For this purpose, the influence of a specific deformation D (x', y') of optical surface 45 on the intensity-weighted pupil distortion or on the intensity-weighted local area change in the illumination pupil is determined.

Afterward, a desired value of the illumination parameter, i.e., the intensity-weighted pupil distortion or of the intensity-weighted area change in the illumination pupil, is predefined. A desired form z (x', y') of optical surface 45 is then determined so that the actual value of the illumination parameter corresponds to the desired value of the illumination parameter within predefined limits. The necessary deformation D (x', y') can then be determined by comparing the desired form with the actual form of optical surface 45. Finally, optical surface 45 is deformed using actuator units 49 so that an actual form of optical surface 45 corresponds to the desired form. These determining steps and the predefining of the actuating values for actuator units 49 are processed in the determining and predefining device 54.

Pairs of basis functions firstly for the profile over the illumination pupil and secondly for the profile of the wavefront over the field can be assigned to imaging aberrations known from optics. For example, the pair of basis functions Z10 and F10 chosen above corresponds to the imaging aberration "a three-leaf clover".

Other pairs of basis functions correspond to other known imaging aberrations.

Z4 and F4 correspond to the Seidel image aberration "image field curvature". Z7 and F2 correspond to the Seidel image aberration "coma".

Z2 and F2 correspond to a scale aberration.
Z2 and F7 correspond to a third-order distortion.
Z5 and F5 correspond to an astigmatism.
Z7 and F7 correspond to a coma aberration of the next-higher field order.

Certain embodiments have been described. Other embodiments are in the following claims.

What is claimed is:

1. A method for setting an illumination optical unit comprising a plurality of optical surfaces for guiding and shaping a beam of illumination light, wherein an illumination parameter to be set is predefined across an object field to be imaged into an image field, the method comprising:
    determining at least one actual value of the intensity-weighted illumination parameter of the illumination optical unit at a plurality of field points and for a plurality of illumination angles;
    determining the influence of a deformation of at least one of the optical surfaces of the illumination optical unit on the at least one illumination parameter;
    predefining a desired value of the illumination parameter;
    determining a desired form of the at least one optical surface whose deformation influence has been determined, in such a way that the actual value of the illumination parameter corresponds to the desired value of the illumination parameter within predefined limits; and deforming the optical surface with the aid of at least one actuator which exerts a mechanical stress on the optical surface in such a way that an actual form of the optical surface corresponds to the desired form.

2. The method of claim 1, wherein determining at least the actual value of the intensity-weighted illumination parameter of the illumination optical unit at a plurality of field points and for a plurality of illumination angles comprises the following steps:

determining an intensity-weighted distortion of an illumination pupil at a plurality of field points;

determining an intensity-weighted local area change in the illumination pupil at a plurality of field points, wherein, for determining the influence of the deformation of at least one of the optical surfaces of the illumination optical unit on the at least one illumination parameter, the following step is carried out:

determining the influence of the deformation of the optical surface on the intensity-weighted distortion and/or the intensity-weighted local area change.

3. The method of claim 1, wherein determining at least one actual value of an intensity-weighted illumination parameter of the illumination optical unit at a plurality of field points comprises a simulation and/or a measurement of a wavefront of the illumination light in a field plane and/or in a pupil plane.

4. The method of claim 3, wherein during the determining process, the wavefront is characterized by an orthogonal function set.

5. The method of claim 4, wherein during the determining process, individual functions of the function set are set to a target value.

6. An apparatus for setting an illumination optical unit comprising a plurality of optical surfaces for guiding and shaping a beam of illumination light, wherein an illumination parameter to be set is predefined across an object field to be imaged into an image field, comprising:

a determining and predefining device configured for:

determining at least one actual value of an intensity-weighted illumination parameter of the illumination optical unit at a plurality of field points and for a plurality of illumination angles, for determining the influence of a deformation of at least one of the optical surfaces of the illumination optical unit on the at least one illumination parameter, for predefining a desired value of the illumination parameter, for determining a desired form of the at least one optical surface whose deformation influence has been determined, so that the actual value of the illumination parameter corresponds to the desired value of the illumination parameter within predefined limits; and a deformation device comprising at least one actuator which exerts a mechanical stress on the optical surface to deform the optical surface so that an actual form of the optical surface corresponds to the desired form.

7. The apparatus of claim 6, wherein the deformation device has a plurality of actuators for deforming the optical surface.

8. An illumination optical unit for illuminating an object field to be imaged into an image field, comprising a setting apparatus according to claim 6.

9. An optical system comprising an illumination optical unit according to claim 8 and comprising a projection optical unit for imaging the object field into the image field.

10. A projection exposure apparatus for projection lithography, comprising:

an optical system according to claim 9;

a radiation source for generating illumination light;

a reticle holder for holding a reticle having structures to be imaged in the object field; and a wafer holder for holding a wafer in the image field.

11. A method for producing patterned components comprising the following steps:

providing a substrate or wafer, to which a layer composed of a light-sensitive material is at least partly applied, providing a reticle having structures to be imaged, providing a projection exposure apparatus according to claim 10, projecting at least one part of the reticle onto a region of the layer of the substrate with the aid of the projection exposure apparatus.

* * * * *

UNITED STATES PATENT AND TRADEMARK OFFICE
CERTIFICATE OF CORRECTION

PATENT NO.         : 8,345,219 B2                               Page 1 of 1
APPLICATION NO.    : 13/469240
DATED              : January 1, 2013
INVENTOR(S)        : Joachim Hartjes et al.

It is certified that error appears in the above-identified patent and that said Letters Patent is hereby corrected as shown below:

Title Page Col. 1 (Inventors),
Line 3, delete "Obekochen" and insert --Oberkochen--

Signed and Sealed this
Nineteenth Day of March, 2013

Teresa Stanek Rea
*Acting Director of the United States Patent and Trademark Office*